United States Patent
Ichino et al.

(10) Patent No.: US 7,484,967 B2
(45) Date of Patent: Feb. 3, 2009

(54) OPTICAL MODULE WITH A FLEXIBLE PRINTED CIRCUIT BOARD TO BE ELECTRICALLY CONNECTED WITH A HOST BOARD

(75) Inventors: Moriyasu Ichino, Yokohama (JP); Satoshi Yoshikawa, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 11/623,597

(22) Filed: Jan. 16, 2007

(65) Prior Publication Data

US 2007/0190847 A1    Aug. 16, 2007

(30) Foreign Application Priority Data

Jan. 20, 2006 (JP) ............................. 2006-012143
Apr. 24, 2006 (JP) ............................. 2006-118753

(51) Int. Cl.
  *H01R 12/00*  (2006.01)
(52) U.S. Cl. .................... 439/67; 439/495; 439/329; 439/79; 439/76.1
(58) Field of Classification Search ................ 257/786; 361/760; 439/67
   See application file for complete search history.

(56) References Cited

U.S. PATENT DOCUMENTS 7,327,042 B2 * 2/2008 Ohazama ..................... 257/786

FOREIGN PATENT DOCUMENTS

| JP | 05-061063 | 3/1993 |
| JP | 2004-193466 | 7/2004 |
| JP | 2005-050971 | 2/2005 |

* cited by examiner

*Primary Examiner*—Truc T Nguyen
(74) *Attorney, Agent, or Firm*—Fish & Richardson P.C.

(57) ABSTRACT

The present invention is to prevent a snapping of wiring patterns formed on a flexible printed circuit (FPC) board by bending the FPC board and to make the length of the pattern short to suppress the degradation of high frequency signals transmitted on the wiring pattern. The FPC board provides a via hole in the land region formed on a primary surface of the FPC board and to be attached to the host board. The wiring pattern, which is formed on a secondary surface opposite to the primary surface and is made of copper foil, is drawn from the via hole at the secondary surface. The wiring pattern is covered by a cover layer. Bending the FPC board such that the primary surface is outside, the FPC board is bent at a boundary of the land region at the primary surface, while; the FPC board provides the cover layer on a region of the secondary surface corresponding to the land region, which prevents the wiring pattern on the second region from snapping.

5 Claims, 8 Drawing Sheets

OPTICAL MODULE WITH A FLEXIBLE PRINTED CIRCUIT BOARD TO BE ELECTRICALLY CONNECTED WITH A HOST BOARD

BACKGROUND OF THE INVENTION

1. Field of the Invention

The present invention relates to an optical module with a flexible printed circuit board, in particular, the invention relates to an optical module with a specific connecting structure with a host board.

2. Related Prior Art

An optical module generally includes optical subassemblies (OSA) installing a laser diode (LD) or a photodiode (PD) and a circuit board installing electronic circuits to control the LD or the PD. The module is required with a small sized appearance and with a high transmission speed. The OSA provides a plurality of lead pins to guide electrical signals from/to the electronic circuits. In order to maintain the signal quality from/to the OSA, it is necessary to satisfy an impedance matching condition around the lead pins, namely, the lead pin itself and the wirings connected to the lead pins.

FIG. 8 shows a conventional wiring configuration between the circuit board 200 and the OSA 10 with lead pins 11. Because the lead pins 11 inevitably accompany with parasitic inductance, which causes an impedance mismatching condition, it is necessary to compensate this impedance mismatching with additional circuit components. When the transmission speed of the optical module enters Giga Hertz band and reaches 10 GHz, the impedance mismatching of the wiring pattern may be fatal to transmit a signal with good quality. One solution for such subject is to shorten the length of the lead pin and to use a flexible printed circuit (FPC) board between the lead pin 11 and the circuit board 200 on which impedance matched wiring patterns are implemented.

However, when the FPC board 100 connects the OSA 10 with the circuit board 200 and a portion of the FPC board 100 bent as the cupper foil of the wiring pattern is exposed, the copper foil is occasionally snapped. FIG. 8 shows an example to prevent the copper foil of the FPC board 100 from being snapped, where an additional adhesive 30 covers and supports the copper foil so as to bend the FPC board 100 at a portion R not covered by the adhesive 30.

A Japanese Patent Application published as JP-2005-050971A has disclosed a FPC board with additional cover film on a region between a bonding pad and an original cover film such that, when the FPC board is inserted with the lead pin of the electronic component into the bonding pad and bent at the region aside the bonding pad, the copper foil electrically connected to the bonding pad is not snapped. Another Japanese Patent Application published as JP-H05-061063A has disclosed a configuration to reinforce a portion where the FPC board is connected to the liquid-crystal panel by covering the contact portion with a resin curable with ultraviolet rays. Still another Japanese Patent Application published as JP-2004-193466A has disclosed a configuration of the FPC board in which, by covering a portion of the wiring pattern on the FPC board with silicone resin, stress likely to concentrate on the bent portion at an edge of the cover film may be relaxed.

In a conventional method where an additional film covers a boundary portion between the pad and the original cover film securing the pad, it is restricted in one direction for the FPC board to be bent, that is, the FPC board must be bent to a direction where the cover film comes inside. Moreover, the bending diameter of the FPC board must be large, which prolongs the wiring pattern on the FPC board and restricts the miniaturization of the optical module.

The method that uses the resin curable with the ultraviolet rays requires additional processes for irradiating the ultraviolet rays. Moreover, it is hard to bend a portion where the additional resin is cured, which makes a gap between the OSA and the substrate wide and prevent the miniaturization of the optical module.

The present invention is to provide a new arrangement of the FPC board connecting the OSA to the circuit board, which is configured to prevent the snapping of the wiring patterns formed on the FPC board by bending and to shorten the patterns to suppress the degradation of the high frequency signals transmitted on the wiring pattern. The invention also provides an optical module installing such new arrangement of the FPC board.

SUMMARY OF THE INVENTION

One aspect of the present invention relates to a configuration of a flexible printed circuit (FPC) board. The FPC board includes a land region in a primary surface to be attached to a host board, a wiring patter in a secondary surface opposite to the primary surface, and a via hole that is configured to be drawn from the land region and to connect the land region electrically to the wiring pattern. The FPC board according to the present invention, when the FPC board is bent such that the primary surface becomes outside, the wiring pattern on the secondary surface may cross a virtual plane reflecting the boundary of the land region and at least a portion of the wiring pattern crossing the virtual plane may be covered by a cover layer.

Another aspect of the present invention relates to an optical module that includes; an optical subassembly (OSA) installing a semiconductor optical device, an electronic circuit communicating with the semiconductor optical device, a host board installing the electronic circuit, and a flexible printed circuit (FPC) board connecting the OSA with the host board. The FPC board includes a land region on a primary surface that faces and comes in contact to the host board, a wiring pattern on a secondary surface opposite to the primary surface, and a via hole that is drawn from the land region and connects the land region electrically to the wiring pattern. The FPC board is bent such that the primary surface thereof becomes outside. The wiring pattern on the secondary surface may cross a virtual plane reflecting the boundary of the land region and at least a portion crossing the virtual plane may be covered by a cover layer.

DESCRIPTION OF PREFERRED EMBODIMENTS

Figure 1:
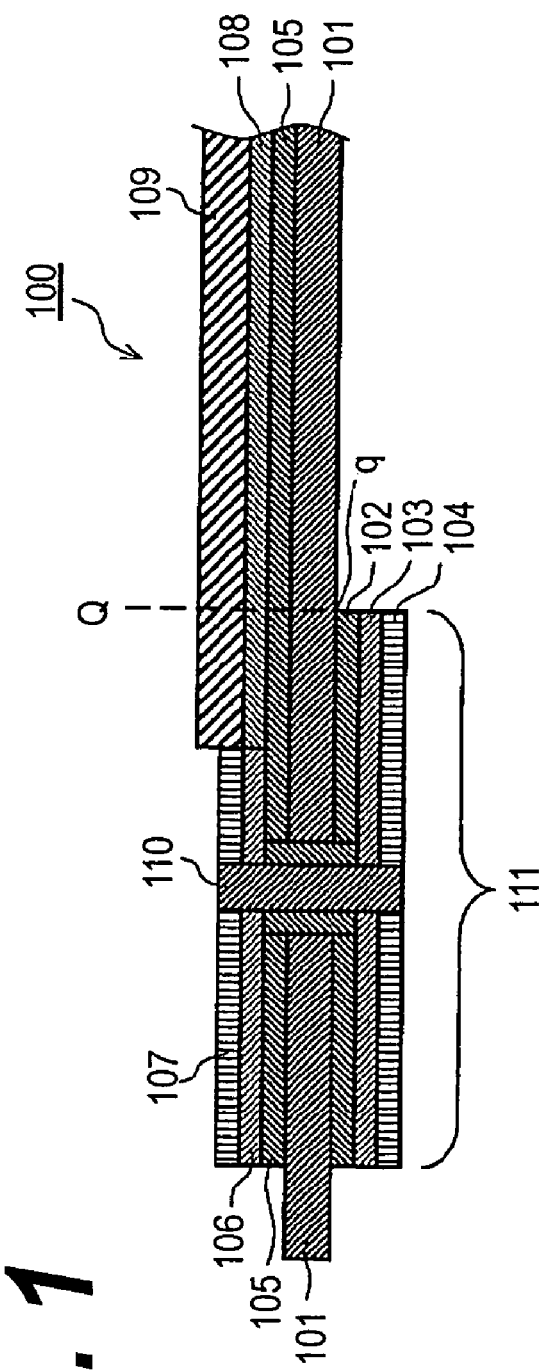
FIG. 1 is a cross section of a flexible printed circuit board according to an embodiment of the present invention.

Next, preferred embodiments of the present invention will be described as referring to accompanying drawings. FIG. 1 is a cross section of the FPC board 100; in particular, FIG. 1 shows a coupling portion of the FPC board 100 with the circuit board 200. The FPC board 100 provides a base board 101, a copper foil 102 on a primary surface of the FPC board 100, a nickel coating 103 on the primary surface, a gold coating 104 on the primary surface, a copper foil 105 on a secondary surface, a nickel coating 106 on the secondary surface, a gold coating 107 on the secondary surface, an adhesive layer 108, a cover layer 109, a via hole 110, and a land region 111.

The FPC board 100 provides the land region 111 to be connected with the host board. In the explanation, a side of the FPC board 100 where the land region 111 is provided is defined as the primary surface, while the other side is defined as the secondary surface. Moreover, a left side of the land region in FIG. 1 is defined as an outer side, while, a right hand side in FIG. 1 is defined as an inner side.

The land region 111 stacks, on the base board 101, the copper foil 102, the nickel coating 103, and the gold coating 104. The land region 101 does not provide the cover layer 109 to electrically come in contact with the host board. The gold coating 104 with the nickel coating 103 protects the copper foil 102 from oxidizing. The nickel coating enhances the adhesiveness of the gold coating 104 with the copper foil 102.

Other arrangements may be available to protect the copper foil 102 from oxidizing, for instance, a solder is provided on the copper foil 102, which is called as a solder leveler, or some flux coats the surface of the copper foil 102. The gold coating 104 may be superior form viewpoints of the stableness and the reliability. Thickness of the gold coating 104 may be smaller than 0.1 μm, while, that of the nickel coating 103 may be between 3.0 to 8.0 μm. The copper foil 102 has a thickness of about 18 μm.

The land region 111 provides a via hole 110. On the secondary surface of the land region 111 is provided with another copper foil 105 immediately on the base board 101. The copper foil 105 forms interconnections that is electrically connected with the gold coating 104 on the primary surface thorough the via hole 110 and finally connected with the host board 200, which is described later. Within the via hole 110 is filled with or coated with stacked metals of the copper, the nickel, and the gold similar to those on the primary and the secondary surface of the FPC board 100.

In an inner side of the gold coating 107 and the nickel coating 106 in the secondary surface is provided with the cover layer 109 to protect the copper foil 105. This cover layer 109 is stacked with the copper foil 105 with the adhesive 108.

When an edge of the stacked metal of the copper foil 102, the nickel coating 103, and the gold coating 104 on the primary surface is denoted as q, and a virtual plane including the edge q and perpendicular to the base board 101 is denoted as Q, the interconnections on the secondary surface crosses this virtual plane Q. The cover layer 109 covers at least a portion of the land region 111 on the secondary surface, that is, the cover layer 109 extends the land region 111 on the secondary surface by crossing the virtual plane Q.

Figure 2:
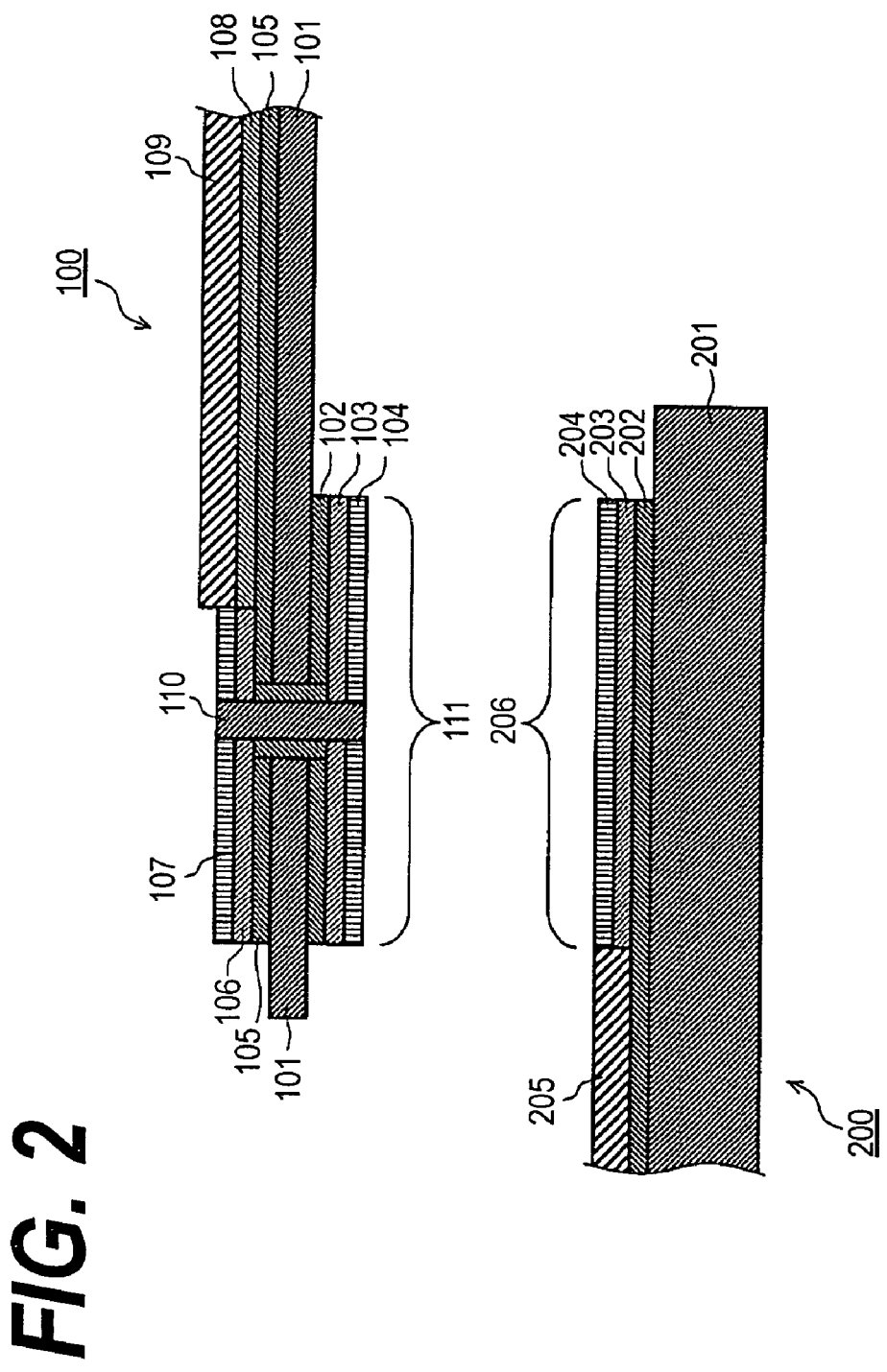
FIG. 2 shows the flexible printed circuit board shown in FIG. 1 and a host board to be connected with the flexible printed circuit board.

FIG. 2 shows an arrangement of the FPC board 100 and the host board 200 to be connected with the FPC board 100. The host board 200 provides an interconnection 202 made of copper foil on a base board 201 that is generally made of glass epoxy material. A resist film 205 covers the host board 200 except a land region 206 thereof, where a stacked metal of the nickel coating 203 and the gold coating 204 is exposed similar to the arrangement of the FPC board 100. A size of the lad region 111 of the FPC board 100 is comparable to or smaller than the land region 206 of the host board 200, and two land regions, 111 and 206, are fixed and electrically connected to each other.

Figure 3:
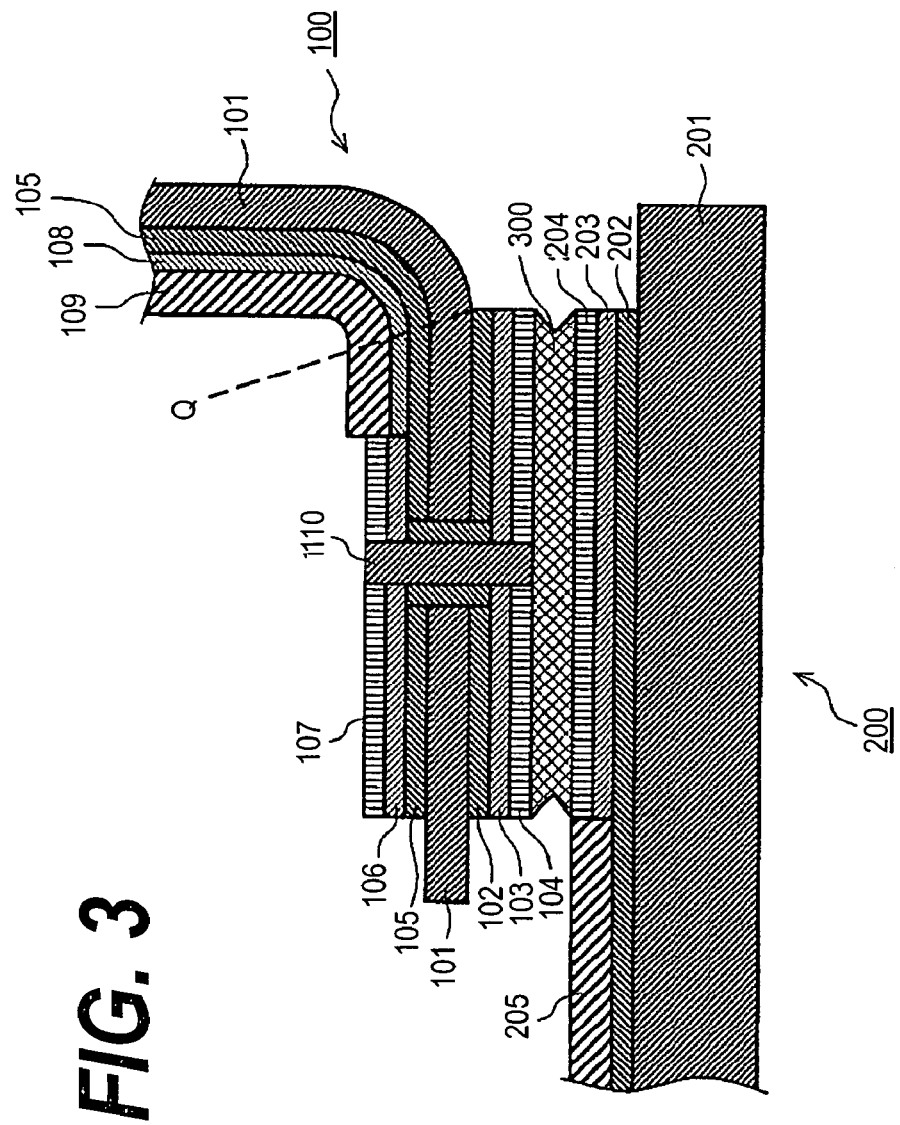
FIG. 3 shows a cross section when the flexible printed circuit board connected to the host board and bent upward.

FIG. 3 shows an arrangement when the FPC board 100 is connected with the host board 200 in land regions, 111 and 206, with a solder 20. In this arrangement, the FPC board 100 is bent about right angle to be electrically connected with an optical subassembly. In the present embodiment, the FPC board 100 is bent at the virtual plane Q. Because this virtual plane Q locates at the edge of the nickel coating 103 of the primary surface and the other nickel coating 106 of the secondary surface is outside the virtual plane Q, both nickel coatings, 103 and 106, may be prevented from bending. Further, the copper foil 105 is covered with the cover layer 109 in the secondary surface; accordingly, the copper foil 105 for the interconnection may be prevented from snapping.

Figure 4:
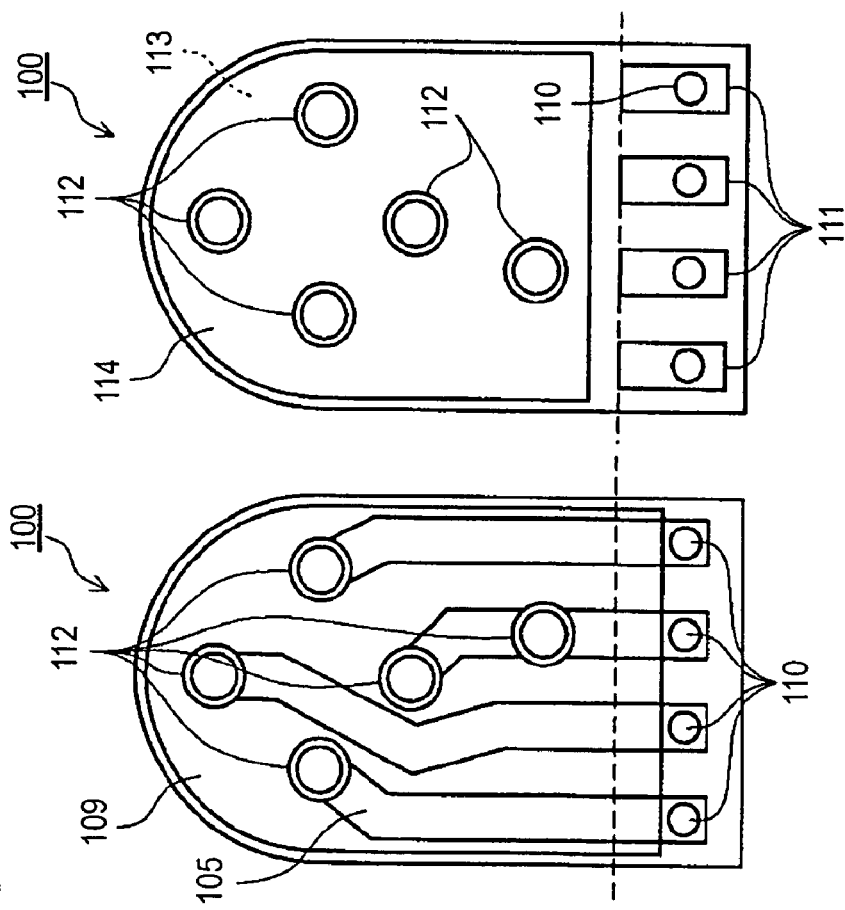
FIG. 4 is a plan view of the flexible printed circuit board according to the embodiment of the present invention.

FIGS. 4A and 4B are plan views of the FPC board 100 according to the present embodiment. FIG. 4A is a plan view of the secondary surface, while, FIG. 4B is a plan view of the primary surface viewed from the land region 111. As shown in FIG. 4, the FPC board 100 provides a plurality of land regions 111 and each land region 111 configures the same stack that shown in FIGS. from 1 to 3.

On the primary surface of the FPC board 100 is formed with four interconnections 105 made of copper foil with the cover layer 109 on the top thereof. An end portion of each interconnection 105 is exposed from the cover layer 109 and forms a via hole 110 thereat. The via hole 110 is connected to the gold coating 104 of the land region 111 in the primary surface as shown in FIG. 1. On the via hole 110 in the secondary surface is exposed from the cover layer 109. The other end portion of each interconnection 105 also forms another via hole 112 that is guided to the primary surface.

The primary surface of the FPC board 100 provides a copper foil 113 in almost whole portion thereof except the land region 111 and portions corresponding to the other via holes 112 provided in the end portion of the interconnection 105. The cover layer 114 covers the copper foil 113.

Figure 5:
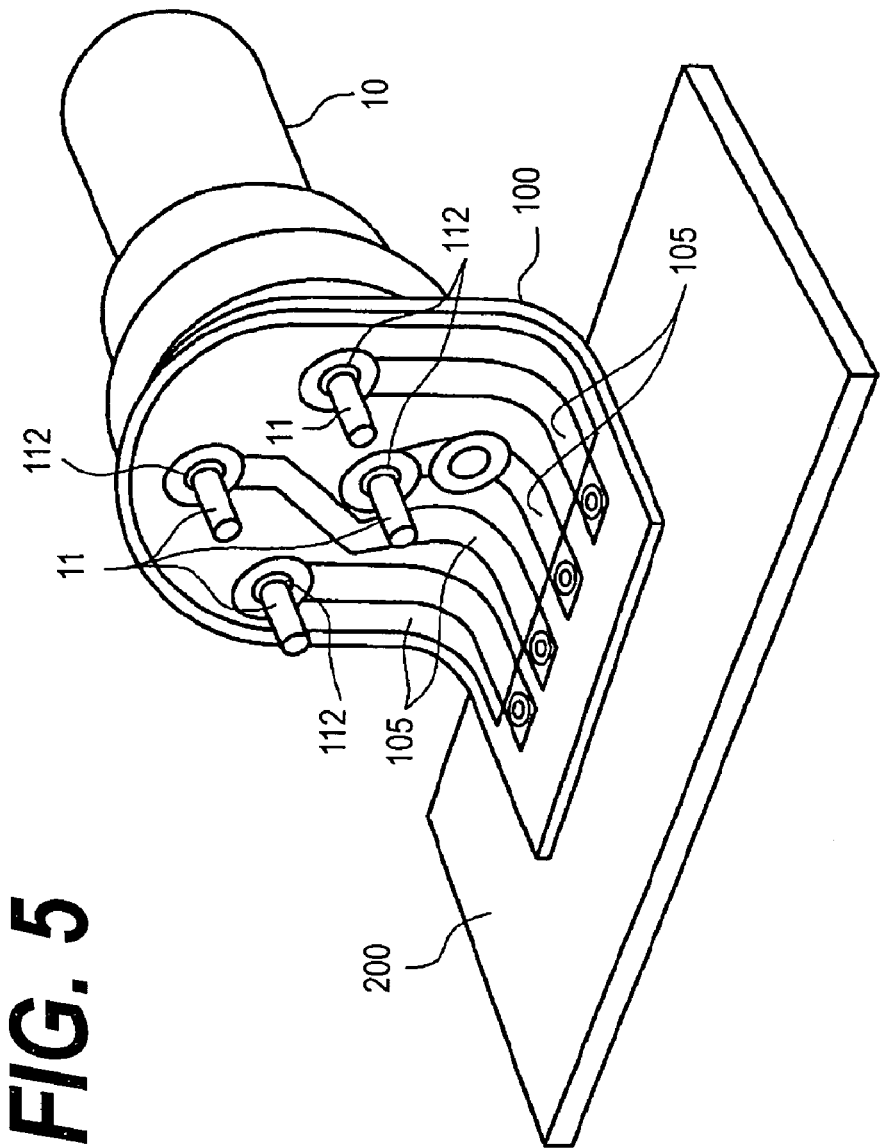
FIG. 5 is a perspective view of the flexible printed circuit board connecting the optical subassembly with the host board.

FIG. 5 is a perspective view showing the FPC board of FIG. 4 that connects the OSA 10 to the host board 200. The OSA 10 includes a laser diode (LD) and a photodiode (PD) and has four lead pins 11 each connected to the cathode of the LD, the anode of the PD, the OSA package, and commonly connected to the anode of the LD and the cathode of the PD. Four via holes 112 formed in the end portion of the interconnection 105 receive these lead pins 11. That is, the lead pin 11 passes through the via hole 112.

Interconnections connected to the lead pins except for the ground pin have specific width and gaps to the neighbor interconnections, and the base board 101 of the FPC board also has a specific thickness to satisfy the impedance matching condition for the interconnection 105 with the copper foil 13, as shown in FIG. 4. That is, by adjusting the width of the interconnection 105 and the gaps to the neighbor interconnection, the characteristic impedance of the interconnection 105 on the secondary surface may be controlled because the primary surface of the FPC board 100 has the copper foil covering the substantial whole area of the base board 101, which forms a microstrip line.

Figure 6:
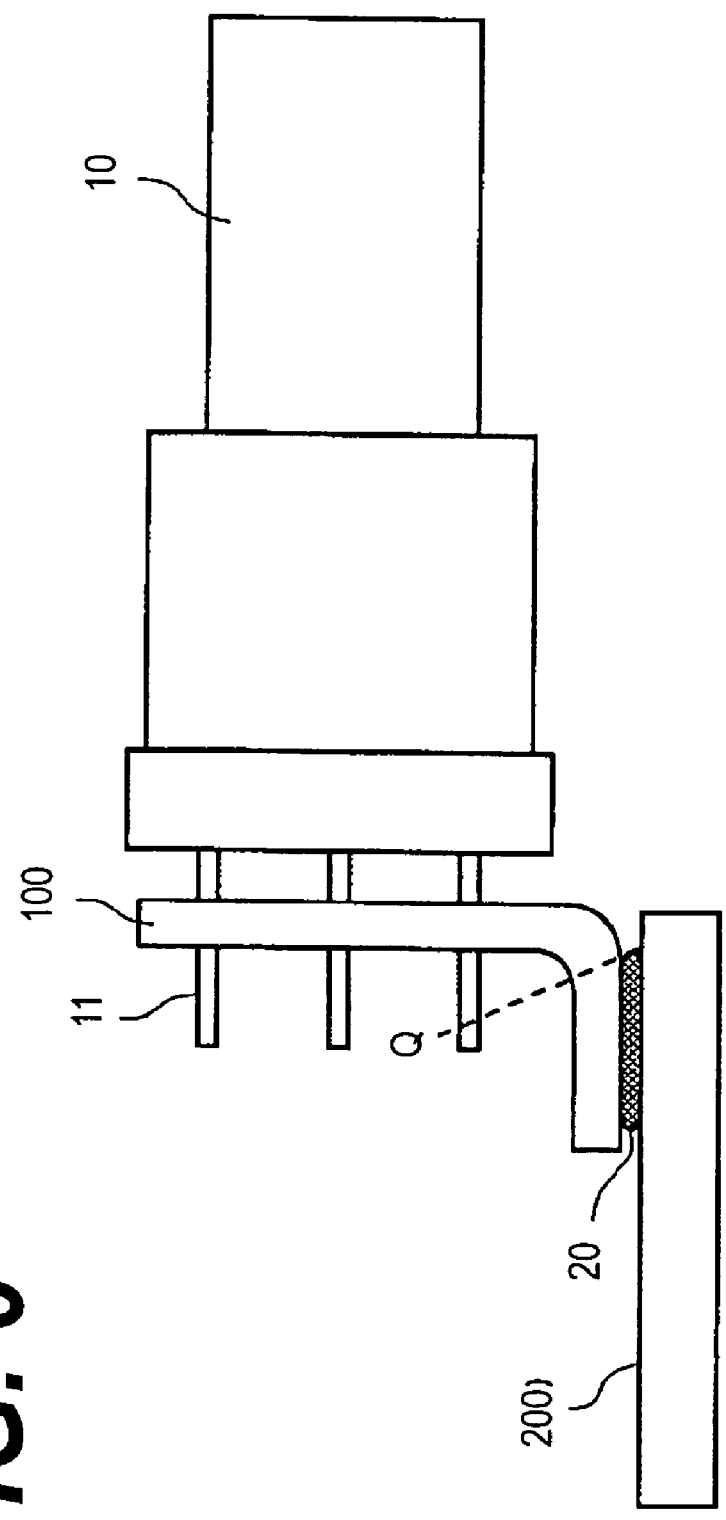
FIG. 6 is a side view when the flexible printed circuit board connects the optical subassembly with the host board.

FIG. 6 is a side view of the OSA 10 connected to the host board 200 with the FPC board 100. The FPC board 100 is bent at the virtual plane Q extending form the edge of the land region when the OSA 10 with the lead pins 11 and the FPC board 100 provides the via holes 112 into which the lead pin 11 is inserted. The virtual plane Q, as shown in FIG. 3, crosses inner side of the nickel coating at the secondary surface, accordingly, the nickel coatings of the primary and secondary surfaces does not bend and may be prevented from snapping. Moreover, the cover layer 109 of the secondary surface covers the interconnections 105 thereon; accordingly, the interconnections 105 may be prevented from snapping.

The arrangement of the FPC board 100 of the present embodiment may shorten the length thereof from the OSA 10 to the host board 200, which may not only match the characteristic impedance of the interconnection but also suppress the loss of the high frequency signal. Thus, according to the present invention, the high frequency performance of the optical module and the optical module may be improved.

Figure 7:
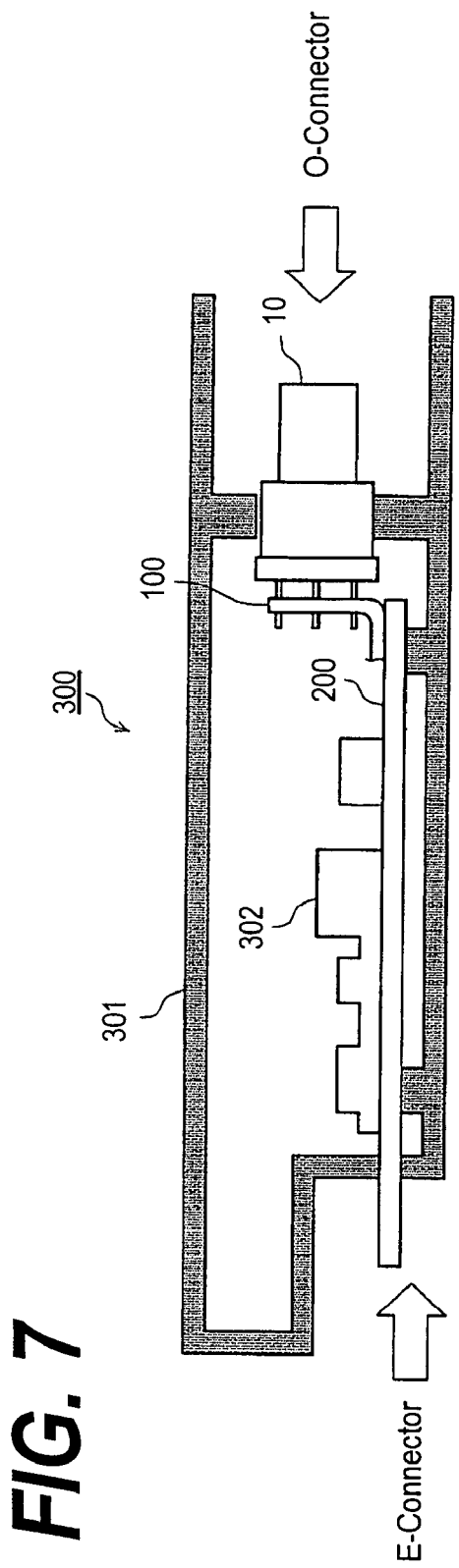
FIG. 7 is a schematic view of an optical module installing the optical subassembly electrically connected to the host board with the flexible printed circuit board of the present invention.
Figure 8:
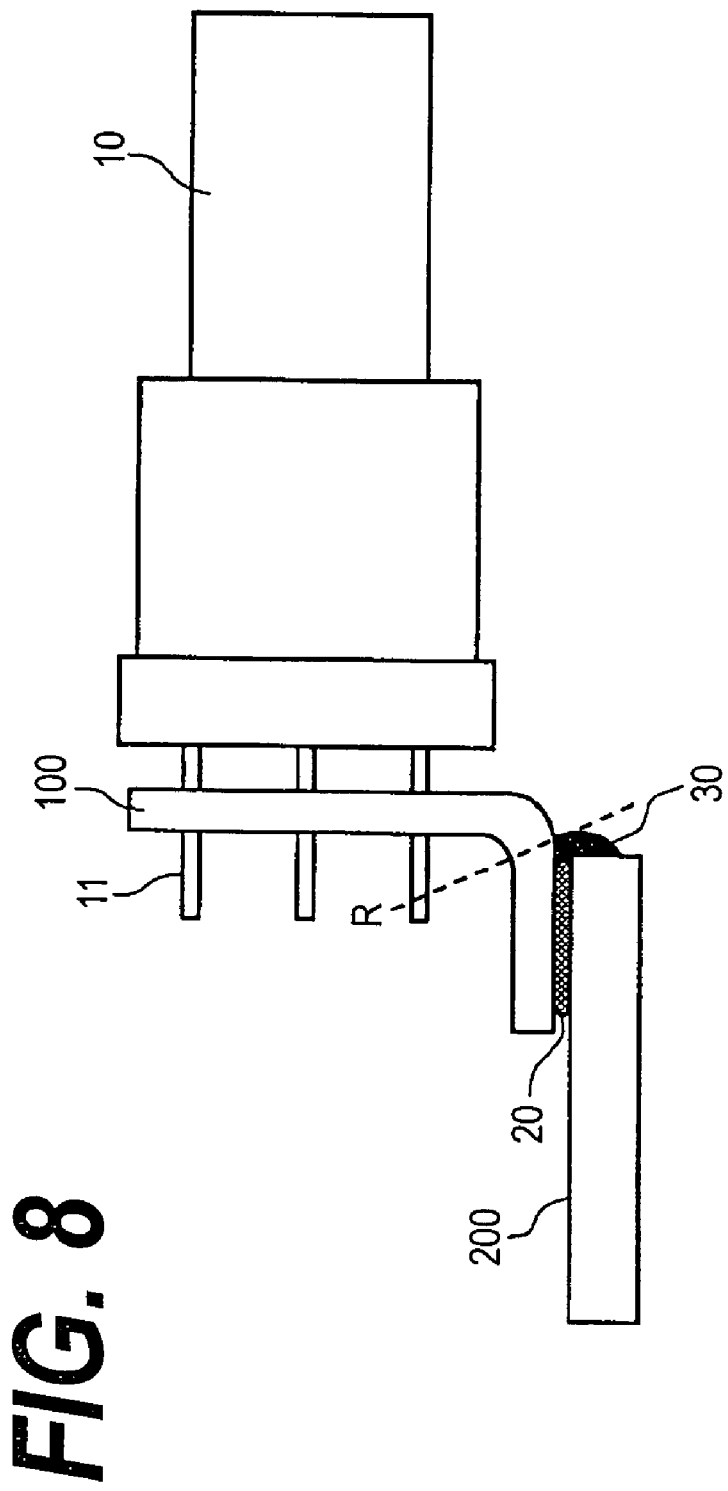
FIG. 8 shows a conventional arrangement of the flexible printed circuit board to prevent the snapping of the wiring patterns on the flexible printed circuit board.

FIG. 7 shows a schematic drawing that explains an arrangement of an optical module installing the OSA 10, the host board 200, and the FPC board 100. The optical module 300 includes a housing 301 and an electronic circuit 302 on the host board 200. The optical module 300 includes, as the OSA 10, a transmitter optical subassembly (TOSA) and a receiver optical subassembly (ROSA) to perform the full-duplex optical communication.

The ROSA includes a semiconductor light-receiving device such as avalanche photodiode (APD) and a PIN-photodiode (PIN-PD), and a pre-amplifier to amplify a faint electrical signal converted by such PD. The TOSA includes a laser diode (LD) to emit signal light and a photodiode to monitor the amplitude of the signal light. The TOSA occasionally installs a thermo-electric device such as Peltier element to adjust a temperature of the LD, and sometimes provides a driver circuit to drive the LD when the operational speed of the LD reaches and exceeds 10 GHz. These OSAs are built with an optical receptacle into which an external optical connected is mated to optically couple optical fibers configured within the optical connector with the LD and the PD within the OSAs.

The housing 301 covers the host board 200 on which the electronic circuit 302 is installed. The electronic circuit 302 includes a driver for driving the LD within the TOSA and a signal processor that extracts a clock and regenerates a data from the signal output from the ROSA. When the ROSA installs the APD, the electronic circuit 302 may include a bias supplying circuit for the APD.

When the thermo-electronic device is installed within the TOSA to adjust the temperature of the LD, a driving circuit for the thermo-electric device may be also installed on the host board 302. In addition, when a processor and a memory device to comprehensively control such circuits are also provided, additional circuit board may be installed within the housing, which mounts circuits not processing high frequency signals such as the bias supplying circuit for the APD and the driver for the thermo-electronic device. The rear end of the host board 200 forms an electronic plug that mates with an external electronic connector.

The electronic connection between the circuit 302 on the host board 200 and the OSA 10 may be performed with the FPC board 100 as shown in FIG. 4. Thus, according to the present arrangement of the FPC board, even the FPC board is bent to receive the lead pin of the OSA 10 in one end thereof and to solder with the host board 200 in the other end thereof, the interconnection on the FPC board may be prevented from snapping, which enhances the reliability of the interconnection. Moreover, according to the present invention, the interconnection on the FPC board may be shortened, which secures the impedance matching condition and suppress the signal loss in the high frequency regions.

What is claimed is:

1. An optical module, comprising:
   an optical subassembly that includes a semiconductor optical device;
   an electronic circuit to communicate electrically with the semiconductor optical device;
   a host board on which the electronic circuit is disposed; and
   a flexible printed circuit board electrically connecting the optical subassembly with the host board, the flexible printed circuit board including a land region formed in a primary surface of the flexible printed circuit board, the whole land region facing and electrically in direct contact with the host board, a wiring pattern formed on a secondary surface opposite the primary surface and made of copper foil, and a via hole configured to be drawn from the land region and to connect the land region electrically to the wiring pattern in the secondary surface,
   wherein the flexible printed circuit board is bent at a boundary of the land region such that the primary surface is outside and a portion of the copper foil of the wiring pattern crossing a virtual plane extending from the boundary of the land region in the primary surface to the secondary surface is covered by a cover layer.

2. The optical module according to claim 1, wherein the land region provides no wiring patterns in the primary surface.

3. The optical module according to claim 1, wherein the flexible printed circuit board provides no wiring patterns across the boundary of the land region in the primary surface.

4. The optical module according to claim 1, wherein the land region is made of stacked metal of copper, nickel and gold.

5. The optical module according to claim 1, wherein the optical subassembly provides a lead pin and the flexible printed circuit board provides another via hole into which the lead pin is inserted, and
   wherein the flexible printed circuit board is bent at the boundary of the land region by substantially right angle.

* * * * *